(12) United States Patent  
Ohta (10) Patent No.: US 9,039,215 B2
(45) Date of Patent: May 26, 2015

(54) LIGHT SOURCE DEVICE AND PROJECTION TYPE DISPLAY DEVICE (75) Inventor: Masahiko Ohta, Tokyo (JP)

(73) Assignee: NEC CORPORATION, Tokyo (JP)

( * ) Notice: Subject to any disclaimer, the term of this patent is extended or adjusted under 35 U.S.C. 154(b) by 141 days.

(21) Appl. No.: 13/824,783

(22) PCT Filed: May 31, 2011

(86) PCT No.: PCT/JP2011/062442
§ 371 (c)(1),
(2), (4) Date: Mar. 18, 2013

(87) PCT Pub. No.: WO2012/053245
PCT Pub. Date: Apr. 26, 2012

(65) Prior Publication Data
US 2013/0176705 A1  Jul. 11, 2013

(30) Foreign Application Priority Data

Oct. 21, 2010  (JP) .................................. 2010-236537

(51) Int. Cl.
*F21V 13/12*  (2006.01)
*G03B 21/20*  (2006.01)
*H04N 9/31*  (2006.01)
*F21V 9/00*  (2006.01)
*H01S 5/00*  (2006.01)

(52) U.S. Cl.
CPC .............. *F21V 13/12* (2013.01); *G03B 21/204* (2013.01); *H04N 9/3161* (2013.01); *F21V 9/00* (2013.01); *H04N 9/3105* (2013.01); *H01S 5/005* (2013.01)

(58) Field of Classification Search
CPC .................................... F21V 13/12; F21V 9/00
USPC ............................................. 362/259, 19, 84
See application file for complete search history.

(56) References Cited

U.S. PATENT DOCUMENTS

| 7,040,774 B2* | 5/2006 | Beeson et al. .................. 362/84 |
| 7,408,201 B2* | 8/2008 | Keuper et al. ................... 257/98 |
| 8,562,146 B2* | 10/2013 | Kitano et al. .................... 353/84 |
| 8,708,511 B2* | 4/2014 | Kawakami ....................... 362/84 |
| 2012/0140183 A1* | 6/2012 | Tanaka et al. ................... 353/20 |

FOREIGN PATENT DOCUMENTS

| JP | S6141133 A | 2/1986 |
| JP | 2567552 B | 7/1993 |
| JP | H10269802 A | 10/1998 |
| JP | 2002032930 A | 1/2002 |
| JP | 4054594 B | 10/2003 |
| JP | 2003295319 A | 10/2003 |

(Continued)

OTHER PUBLICATIONS

The international search report for PCT/JP2011/062442 mailed on Jun. 28, 2011.

*Primary Examiner* — Anabel Ton
(74) *Attorney, Agent, or Firm* — Sughrue Mion, PLLC (57) ABSTRACT

A light source device includes a light source unit concluding LD element (1) for emitting a laser beam polarized in a particular direction and lens (2) for condensing the laser beam emitted from LD element (1) and phosphor layer (3) excited by the laser beam condensed by lens (2) of the light source unit to discharge incoherent light. The incident angle of the laser beam to phosphor layer (3) is larger than 0° and smaller than 90°, and the laser beam enters phosphor layer (3) as P-polarized light.

14 Claims, 9 Drawing Sheets

(56) References Cited

FOREIGN PATENT DOCUMENTS

| JP | 2004241142 A | 8/2004 |
|---|---|---|
| JP | 2006210887 A | 8/2006 |
| JP | 2007157906 A | 6/2007 |
| JP | 2008015059 A | 1/2008 |
| JP | 2009063619 A | 3/2009 |
| JP | 2009535654 A | 10/2009 |
| JP | 2010045274 A | 2/2010 |

* cited by examiner

Wave length

Fig. 3B

Wave length

Fig. 3C

Wave length

LIGHT SOURCE DEVICE AND PROJECTION TYPE DISPLAY DEVICE

This application is a National Stage Entry of PCT/JP2011/062442 filed May 31, 2011, which claims priority from Japanese Patent Application 2010-236537 filed Oct. 21, 2010, the contents of all of which are incorporated herein by reference, in their entirety.

TECHNICAL FIELD

The present invention relates to a light source device that uses a laser diode, and a projection type display device including the same.

BACKGROUND ART

Recently, there is known a light source device that uses a solid state light source such as a light-emitting diode, an electroluminescent element, or a laser diode. For example, Patent Literatures 1 to 3 describe light source devices that use light-emitting diodes.

CITATION LIST

Patent Literature 1: JP 2567552 B
Patent Literature 2: JP 10-269802 A
Patent Literature 3: JP 61-41133 A

SUMMARY

Technical Problem

However, the amount of light emitted from one light-emitting diode is generally extremely small. Thus, a plurality of light-emitting diodes must be used to realize a light source device that has a high output, which makes miniaturization of the light source device difficult. An electroluminescent element is not suitable as a light source for a projection type display device or a lighting device because it is a low-luminance surface-emitting light source.

On the other hand, the power/light conversion efficiency of the laser diode is several times higher than that of the light-emitting diode. Thus, by using the laser diode as a light source, a high-output and compact light source device can be realized.

However, light (laser beam) emitted from the laser diode is coherent light. This creates a problem concerning safety of human eyes. Therefore, the use of light discharged from a phosphor excited by the laser beam has been suggested: the idea of using a laser beam (coherent light) after converting it into incoherent light.

Under these circumstances, there is a demand for an improvement in light use efficiency in a light source device including a laser diode, or in various devices or instruments including such light source device.

Solution to Problem

The present invention has been developed with such a demand in mind. An object of the present invention is to further improve light use efficiency in a light source device including a laser diode, and realize a compact and high-output light source device. Another object of the present invention is to further improve light use efficiency in various devices or instruments including the light source device.

According to an aspect of the present invention, a light source device includes: a light source unit including a laser diode for emitting a laser beam polarized in a particular direction and a light collection optical system for condensing the laser beam emitted from the laser diode; and a phosphor layer excited by the laser beam condensed by the light collection optical system of the light source unit to discharge incoherent light. The incident angle of the laser beam to the phosphor layer is larger than 0° and smaller than 90°, and the laser beam enters the phosphor layer as P-polarized light.

According to another aspect of the present invention, a light source device includes a polarization conversion element for rotating the polarizing direction of a laser beam emitted from a laser diode.

According to the present invention, there is provided a projection type display device that includes the light source device of the invention.

Advantageous Effects of Invention

According to the present invention, light use efficiency can be further improved in a light source device including a laser diode, or in various devices or instruments including such light source device.

DESCRIPTION OF EMBODIMENTS

First Embodiment

Figure 1A:
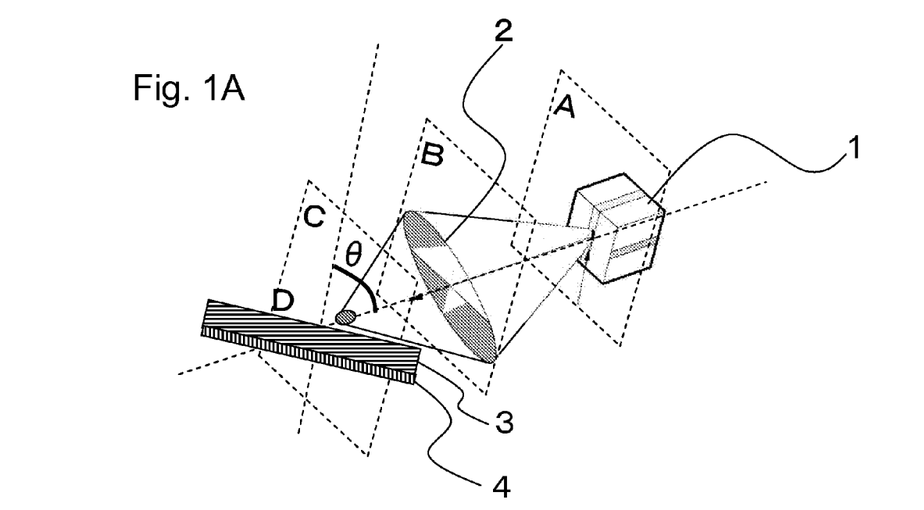
FIG. 1A is a schematic diagram showing the configuration of a light source device according to a first embodiment.

Hereinafter, a light source device according to the first embodiment of the present invention will be described in detail. As shown in FIG. 1A, the light source device according to the embodiment includes: a light source unit including a laser diode (LD element 1) and lens 2 disposed before LD element 1; and phosphor layer 3 disposed before the light source unit.

LD element 1 and phosphor layer 3 are arranged so that a laser beam emitted from LD element 1 can obliquely enter phosphor layer 3. In other words, LD element 1 and phosphor layer 3 are arranged so that the incident angle θ of the laser beam to a surface of the phosphor layer can be larger than 0° and smaller than 90° (0°<θ90°. Further, LD element 1 and phosphor layer 3 are arranged so that the laser beam emitted from LD element 1 can enter as P-polarized light. The incident angle θ is an angle formed between the normal line of phosphor layer 3 and the optical axis of the laser beam. The entry of the laser beam as P-polarized light means that an electric vector oscillates within a plane parallel to an incident plane. Further, the incident plane means a plane formed by both incident light and reflected light. Hereinafter, each of the components of the light source device according to the embodiment will specifically be described.

Figure 2A:
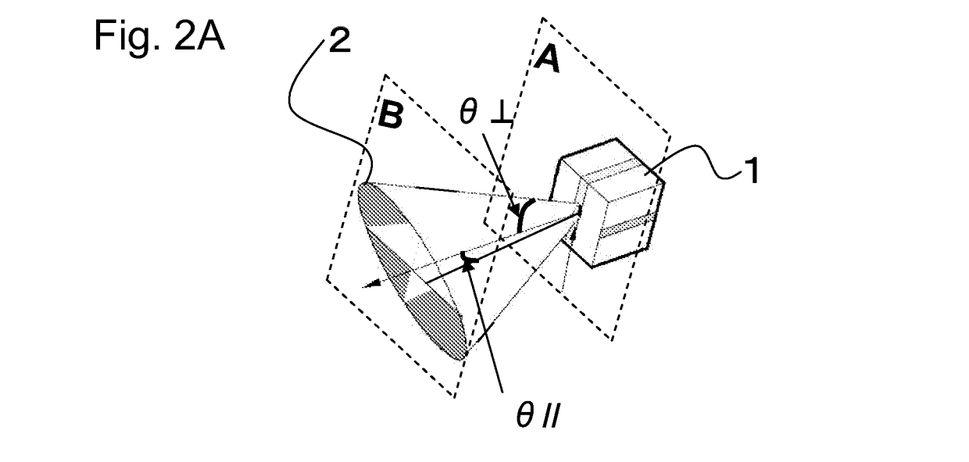
FIG. 2A is a schematic diagram showing the spread angle of a laser beam emitted from a LD element.
Figure 2B:
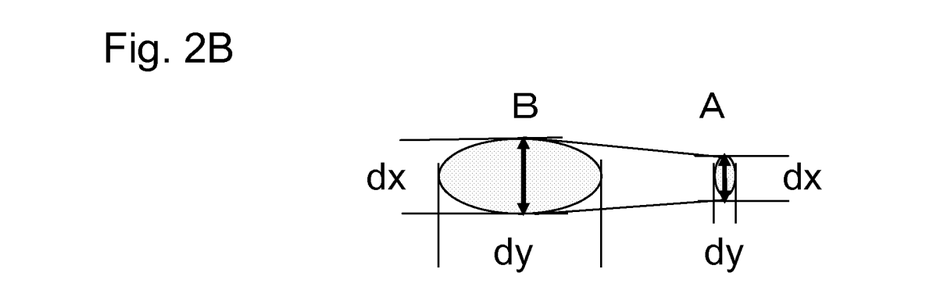
FIG. 2B is a schematic diagram showing a change in beam shape of the laser beam emitted from the LD element.

LD element 1 emits a laser beam that is coherent light. As shown in FIG. 2A, LD element 1 emits laser beams with spread angles of θ⊥ and θ//. FIG. 2B schematically shows a change in beam shape (sectional shape) of the laser beam emitted from LD element 1. As shown in FIG. 2B, the beam shape of the laser beam is elliptical. However, the short-axis direction and long-axis direction of the elliptical shape are switched between a near-field surface and a far-field surface by light diffraction. In the embodiment, in the near-field surface (A-surface), the short-axis direction is defined as a Dy direction, and the long-axis direction is defined as a Dx direction. A diameter in the Dy direction is defined as dy, and a diameter in the Dx direction is defined as dx. In other words, while the Dy direction and the Dx direction are unchanged in the optical system, the sizes and the size relationship of dy and dx change. Specifically, dy<dx is set in the near-field surface (A-surface), while dy>dx is set in the far-field surface (B-surface).

LD element 1 emits a laser beam shorter in wavelength than light discharged from the phosphor of phosphor layer 3. Specifically, LD element 1 emits an ultraviolet, near-ultraviolet, or blue laser beam. Further, the laser beam emitted from LD element 1 is linear polarized light polarized only in the Dx direction. Thus, for the laser beam to enter phosphor layer 3 as P-polarized light, LD element 1 and phosphor layer 3 are arranged so that the Dx direction can be vertical to the surface of the phosphor layer.

Referring back to FIG. 1A, lens 2 is a convex lens or an aspherical lens constituting a light collection optical system for condensing the laser beam on the surface of phosphor layer. The laser beam emitted from LD element 1 is condensed on the surface of phosphor layer by the operation of lens 2.

When the light obliquely enters the object of a refractive index n (0°<incident angle θ<90°, the reflectance of a P-polarized light component (light component where electric vector oscillates within plane parallel to incident plane) on an object surface is lower than that of an S-polarized light component (light component where electric vector oscillates within plane vertical to incident plane) on the object surface. As a result, in the light source device of the embodiment where the incident angle θ is 0°<θ<90°, the laser beam (P-polarized light) can efficiently enter phosphor layer 3. The incident angle θ will be described below in detail.

Phosphor layer 3 includes a phosphor having an absorbing spectrum area that includes the wavelength of the laser beam. Phosphor layer 3 has an area into which the laser beam that is condensed by lens 2 can enter. Further, phosphor layer 3 has a length (thickness) set by taking into consideration the following formula representing absorption intensity:

Absorption intensity: $A0-A=A0(1-\exp[-\alpha L])$

A: laser beam transmission intensity of phosphor layer 3
A0: incident light intensity to phosphor layer 3
α: absorption coefficient
L: length (thickness) of phosphor layer 3

Figure 3A:
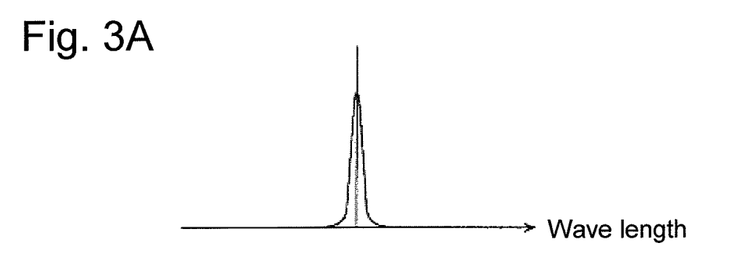
FIG. 3A is a view showing the spectrum of a laser beam.
Figure 3B:
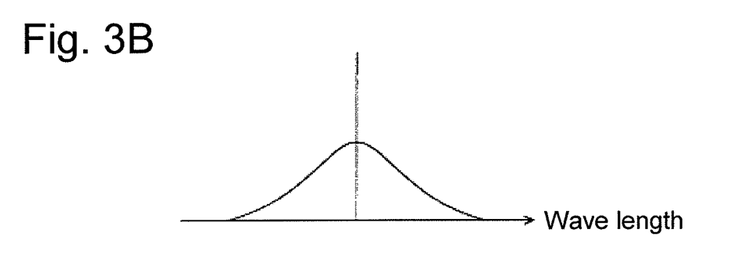
FIG. 3B is a view showing the absorbing spectrum of a phosphor.
Figure 3C:
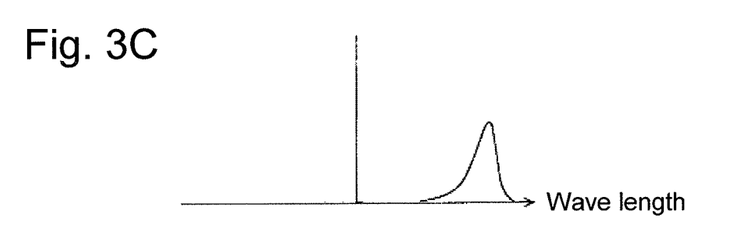
FIG. 3C is a view showing the spectrum of light discharged from the phosphor.

When the laser beam is introduced into phosphor layer 3, the phosphor is excited by the laser beam, and energy in the phosphor changes to a high energy level (excitation level). However, since the excitation level is unstable, the energy in the phosphor changes, after a fixed period of time elapses, to an original ground level or a metastable level between the excitation level and the ground level. At this time, the laser beam is absorbed in the phosphor and the intensity of the laser beam is reduced. Simultaneously, incoherent light is discharged as natural discharged light from the phosphor. FIGS. 3A to 3C respectively show the spectrum of the laser beam emitted from LD element 1, the absorbing spectrum of the phosphor, and the spectrum of the light discharged from the phosphor. The phosphor has the absorbing spectrum shown in FIG. 3B. When the phosphor absorbs the laser beam having the spectrum shown in FIG. 3A, the phosphor emits the light having the spectrum shown in FIG. 3C.

The phosphor of phosphor layer 3 includes, in addition to normal fluorescent material, material such as a pigment or a solid state laser medium that absorbs short wavelength light and discharges longer wavelength light (visible light).

Next, the incident angle θ of the laser beam to phosphor layer 3 will be described in detail from the viewpoint of the reflectance.

Figure 4:
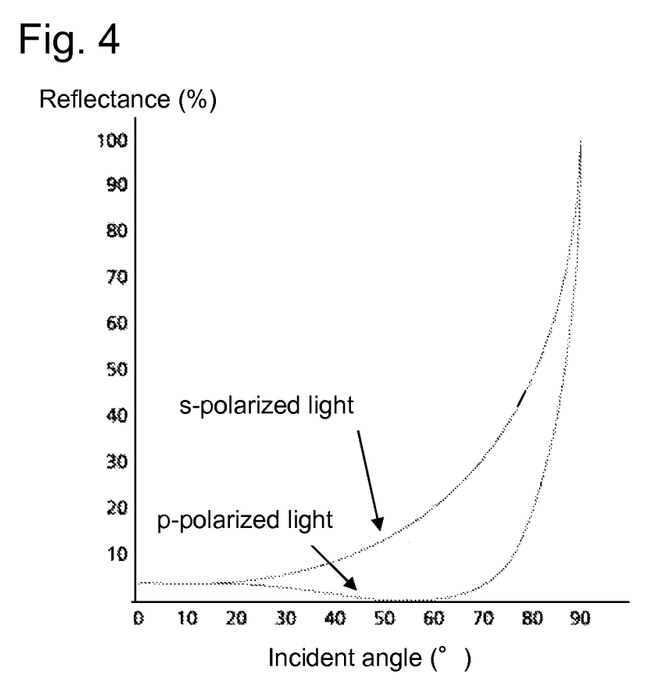
FIG. 4 is a view showing a relationship between the incident angles and the reflectances of P-polarized light and S-polarized light.

FIG. 4 shows the relationship between an incident angle θ and a reflectance (%) when P-polarized light and S-polarized light enter a material having a refractive index of 1.52. It can be understood that basically, within the range of 0°<θ<90°, the reflectance of the P-polarized light is lower than that of the S-polarized light. It can also be understood that in the case of the P-polarized light, the reflectance is less than 20% when the incident angle θ is within the range of 0° to 80°, and less than 10% within the range of 0° to 75°.

Further, there is an incident angle where its reflectance is 0 (no reflection) when the P-polarized light enters an interface between two media having different refractive indexes. This incident angle is referred to as Brewster's angle θb.

Brewster's angle θb is represented by the following formula, in which n1 and n2 denote refractive indexes of the two media:

$\theta b = \text{Arctan}(n2/n1)$

Figure 5:
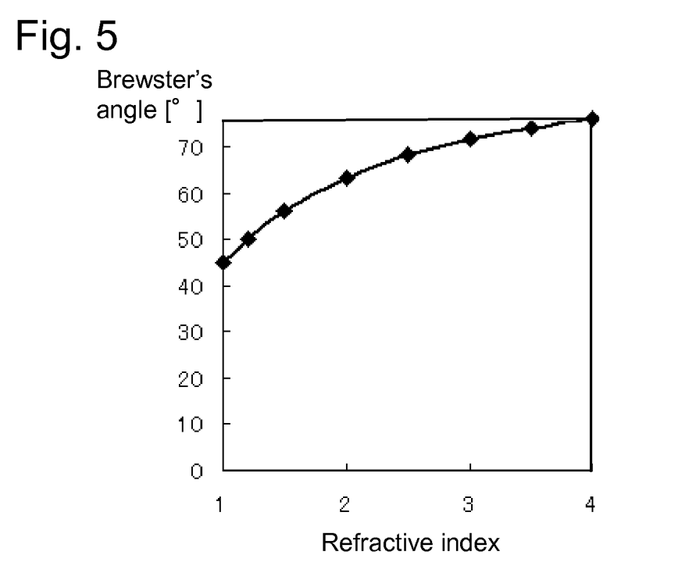
FIG. 5 is a view showing a relationship between the refractive index of a medium and Brewster's angle.

FIG. 5 shows Brewster's angle θb when the P-polarized light enters an interface between air and the media of refractive indexes of 1 to 4. The refractive index of a solvent such as an adhesive forming phosphor layer 3 is generally 1.4 to 1.6. The refractive index of the phosphor itself is generally 1 to 4. Accordingly, the refractive index of phosphor layer 3 is 1 to 4. From a shown graph, it can be understood that when the refractive index of phosphor layer 3 is 1 to 4, corresponding Brewster's angle θb is within the range of 45° to 75°. Thus, by setting the incident angle θ of the laser beam to phosphor layer 3 within the aforementioned range (45° to 75°), energy losses can be prevented, and the phosphor in phosphor layer 3 can be efficiently excited. This can lead to the realization of a light source device that is highly efficient. Further, since the reflectance in the phosphor layer can be reduced without low-reflection coating or the like, the cost of the light source device can be lowered.

Thus, the incident angle θ of the laser beam (P-polarized light) to phosphor layer 3 is desirably within the range of 0°<θ<90°, more desirably within the range of 0°<θ≤80°, further desirably within the range of 0°<θ≤75°. In addition, when Brewster's angle θb dependent on the refractive index of phosphor layer 3 is within the aforementioned range, desirably, the incident angle θ is matched with Brewster's angle θb. For example, when the refractive index of phosphor layer 3 is 2.0, Brewster's angle θb is 63.4°. When the refractive index of phosphor layer 3 is 1.52, Brewster's angle θb is 56.7°. Desirably, therefore, the incident angle θ is set to 63.4° when the refractive index of phosphor layer 3 is 2.0, and to 56.7° when the refractive index of phosphor layer 3 is 1.52.

Next, the incident angle θ of the laser beam to phosphor layer 3 will be described in detail from the viewpoint of use efficiency of light emitted from the light source device. An example where the image forming element of a projection type display device is illuminated with the light from the light source device will be described.

To improve the use efficiency of the light (illumination light) applied to the image forming element, each light flux applied to each pixel area of the image forming element must be prevented from protruding from the pixel area. At least, the amount of light protruding from the pixel area must be reduced as much as possible. To reduce the amount of light protruding from the pixel area as much as possible, generally, the shape (beam shape) of the light flux applied to the pixel area is desirably as similar as possible to that of the pixel area. The shape of the pixel area is generally square. Thus, in view of the propagation characteristics of the beam or the like, the beam shape is desirably similar to a circular shape. To form the shape of the light flux that is applied to the pixel area so that it will be similar to the circular shape, the beam shape of the laser beam that enters phosphor layer 3 must be similar to a circular shape. Even when the shape of the pixel area is other than square (e.g., rectangular), in view of beam propagation or diffraction, the shape of the light flux is desirably similar to a circular shape.

When the laser beam enters phosphor layer 3 shown in FIG. 1A with an incident angle θ, the relationship between the incident angle θ and the beam diameters (dy, dx) of the laser beam is represented by the following formula:

$$\theta = \operatorname{Arccos}(dy/dx)$$

That is, dx, at the time when the laser beam enters a phosphor layer takes a value that is obtained by multiplying dx with 1/cos θ immediately before the laser beam enters the phosphor layer. Since cos θ is 0 or more to 1 or less (0≤cos θ≤1), dx/cos θ is larger than dx. Accordingly, by adjusting the incident angle θ, dx can be increased at the time when the laser beam enters the phosphor layer. In other words, at the time when the laser beams enters the phosphor layer, dy and dx can be matched with each other as much as possible. Further, by adjusting the incident angle θ, the beam shape of the laser beam can be formed into a circular shape. In this case, since the beam is formed into a circular shape by adjusting the incident angle θ, an optical component for forming the beam into a circular shape is not needed, thus reducing costs.

Figure 6:
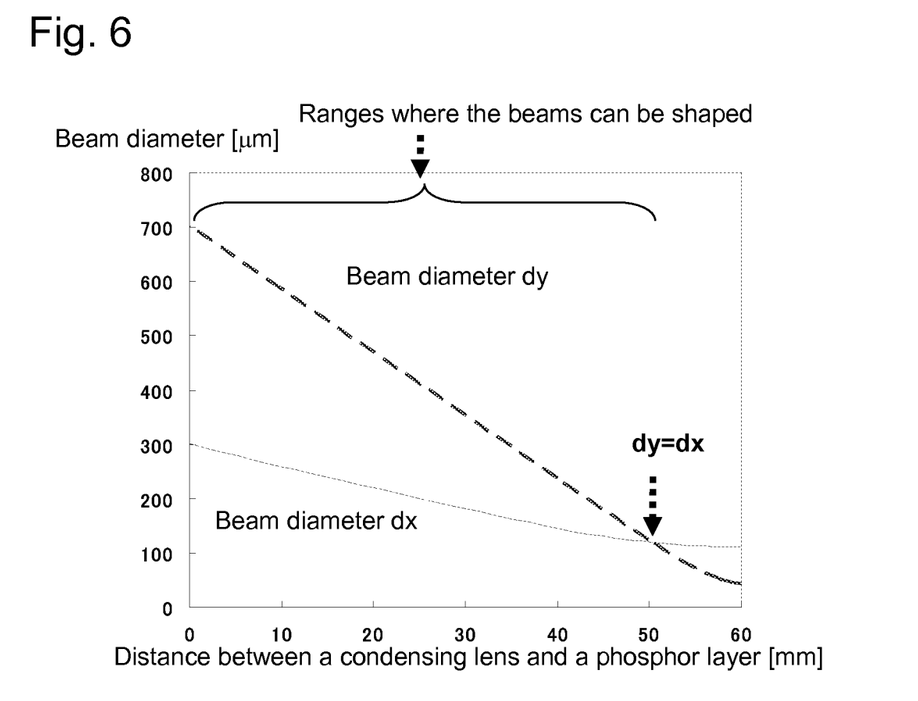
FIG. 6 is a view showing the relationship of beam diameter dy and beam diameter dx between a lens and a phosphor layer shown in FIG. 1A.

When the laser beam is condensed by lens 2 shown in FIG. 1A, a beam waist is formed. At this time, by light diffraction, the size relationship between dy and dx, whichever is bigger, changes between the area near the lens and the area near the beam waist. FIG. 6 shows a change in beam diameter (dy, dx) when a collimator laser beam of dy=700 μm and dx=300 μm is condensed by the lens having a focal length of 60 mm.

As can be understood from FIG. 6, the size relationship between dy and dx, whichever is bigger, is changed from a point where the distance from lens 2 is 52 mm. In the case of the embodiment where the laser beam is linear polarized light that is polarized only in the Dx direction, when the condition of dx<dy is satisfied, the beam can be shaped circular. In other words, when a distance between lens 2 and phosphor 3 shown in FIG. 1A is shorter than 52 mm, the beam can be formed into a circular shape by adjusting the incident angle θ. When dx≥dy is set before the laser beam enters phosphor layer 3, dx is further increased by multiplying dx with 1/cos θ. Thus, the beam cannot be formed into a circular shape by adjusting the incident angle θ.

Figure 1B:
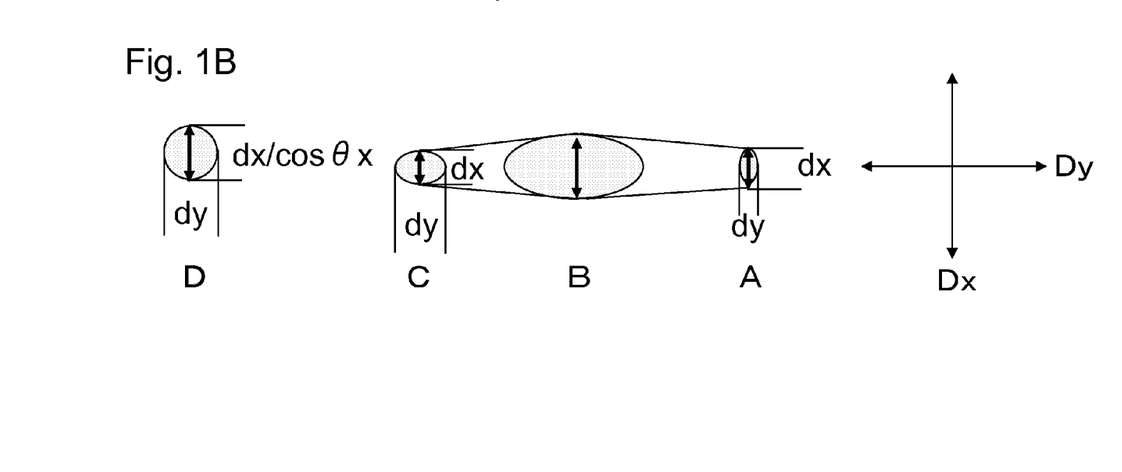
FIG. 1B is a schematic diagram showing a change in beam shape of a laser beam in the light source device.

More detailed description will be made by using specific numerical values. It is assumed that the output Pin of the laser beam emitted from LD element 1 shown in FIG. 1A is 500 mW and that the refractive index n of phosphor layer 3 is 2.0. It is also assumed that dx is 250 μm and dy is 560 μm immediately before the laser beam enters phosphor layer 3 (C surface shown in FIGS. 1A and 1B). In this case, when the incident angle θ is set to 63.4°, cos θ is 0.448. Accordingly, dx is about 560 μm (250/0.448) at the time when the laser beam enters phosphor layer (D surface shown in FIGS. 1A and 1B). Further, when the refractive index n is 2.0, Brewster's angle θb is 63.4° (refer to FIG. 5). Thus, the beam can be formed into a circular shape by using Brewster's angle of limited reflection.

The improvement of the use efficiency of the light emitted from the light source device is equivalent to setting of the etendue of the light source device equal to or lower than that of the image forming element. The etendue is a value representing a spatial spread where the light flux effectively processed in the optical system exists as the product of an area in a light emitting region and a solid angle of light emitted from a device. This etendue value is stored in the optical system. The etendue of the light source device is represented by the product of the area of a light-emitting region in the light source device and the solid angle of the light emitted from the light source device. The etendue of the image forming element is represented by the product of the solid angle of light that enters the element and an effective area. The effective area is a product of a longitudinal length and a horizontal length of each pixel area of the image forming element.

Next, reflection plate 4 shown in FIG. 1A will be described. Reflection plate 4 is disposed to face the rear surface (surface opposite the surface into which the laser beam enters) of phosphor layer 3. Reflection plate 4 has characteristics for reflecting the laser beam and light output from phosphor layer 3. Reflection plate 4 reflects a laser beam component not absorbed by phosphor layer 3, and causes the laser beam enters phosphor layer 3. The laser beam reflected by reflection plate 4 is absorbed by the phosphor during its repassage through phosphor layer 3 to contribute to the generation of incoherent light. Since reflection plate 4 is adjacent to phosphor layer 3, irregular reflection is prevented therebetween, and the laser beam can efficiently return to phosphor layer 3. Light output from the phosphor is isotropically diffused in all directions. Accordingly, a part of the light output from the phosphor directed to the rear surface side of phosphor layer 3 is reflected by reflection plate 4, and returns again to phosphor layer 3. Then, the light that has returned to phosphor layer 3 is directed to the front surface side of phosphor layer 3, and exits from the front surface of phosphor layer 3. As a result, the light output from the phosphor can be efficiently emitted from the front surface side of phosphor layer 3.

When the length (thickness) of phosphor layer 3 is 1.0 mm, and the absorption coefficient α of the laser beam of phosphor layer 3 is 2.0/mm, about 98% of the laser beam emitted from LD element 1 is absorbed by phosphor layer 3 (including light reflected by reflection plate 4 to reenter phosphor layer 3).

The laser beam absorbed by phosphor layer 3 is used for exciting the valance electrons of the phosphor, and most of the electrons are discharged again as light having a long wavelength. However, a part of the excited valence electrons has its excitation energy scattered in the material during the nonradiation process. In this case, the relationship between the intensity (Eph) of natural discharged light from the phosphor and the intensity (Eab) of the laser beam that enters the phosphor is represented by the following formula, in which η denotes a contribution probability of the laser beam absorbed by the phosphor to light that is again discharged:

$$Eph = \eta Eab$$

When the output and the contribution probability of the laser beam emitted from LD element 1 are respectively Pin=500 mW and η=0.9, the output Pout of the natural light discharged from the phosphor is 450 mW. This value corresponds to the output of several commonly used light-emitting diodes. That is, since output that is equivalent to that of several commonly used light-emitting diodes can be acquired from the circular laser beam irradiation area of a diameter of 560 μm, a light source device having limited etendue can be realized. Further, since the output is acquired by one LD element 1 and one phosphor layer, the number of components of the light source device can be reduced. Further, since the volume of one LD element 1 and one phosphor layer is much smaller than that of a light source device including several light-emitting elements, the light source device can be miniaturized.

When the incoherent light is emitted from the rear surface of phosphor layer 3, reflection plate 4 is unnecessary. In this case, a wavelength selection reflective layer for reflecting visible light while transmitting the excited laser beam can be formed in the surface of phosphor layer 3. When phosphor layer 3 generates heat due to irradiation with the laser beam, phosphor layer 3 can be cooled via reflection plate 4. As another cooling method, phosphor layer 3 can be formed on a rotating wheel driven to rotate. In this case, since the rotation of the rotating wheel is accompanied by rotation of phosphor layer 3, heat generation places and phosphor deterioration places are dispersed. Both phosphor layer 3 and reflection plate 4 can be formed on the rotating wheel.

The function of lens 2 shown in FIG. 1A can be realized by combining a plurality of lenses. For example, the function of lens 2 can be realized by a plano-convex lens for converting the laser beam into parallel light and a convex lens for condensing the laser beam that has been converted into the parallel light. In this case, the plano-convex lens and the convex lens are arranged so that the laser beam emitted from the LD element can be transmitted through the plano-convex lens and the convex lens in this order. The plano-convex lens is located with its flat surface directed to the LD element side. The convex lens is located with its convex surface directed to the phosphor layer side. The laser beam emitted from the LD element is converted into the parallel light by the plano-convex lens, and then enters the convex lens (condenser lens). The laser beam (parallel light) that enters the convex lens is condensed on the phosphor layer. Aspherical lenses can be substituted for the plano-convex lens and the convex lens.

When the light source device of the embodiment is used as the light source of the image forming device, the image forming element is irradiated with parallel light. To convert light emitted from the light source device of the embodiment into parallel light, a lens or a reflector for condensing a light flux discharged from the phosphor layer can be used.

Second Embodiment

Figure 7A:
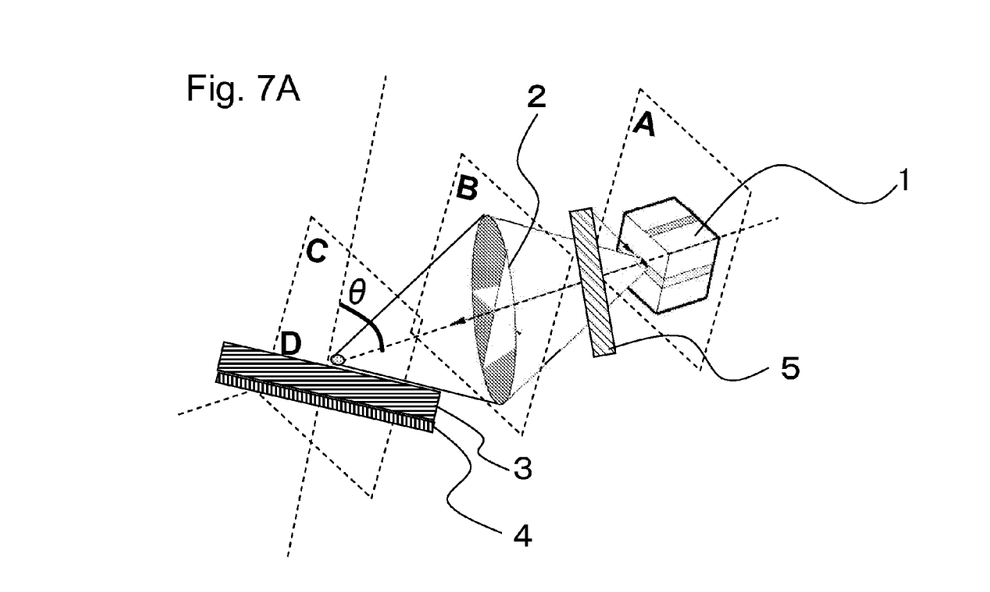
FIG. 7A is a schematic diagram showing the configuration of a light source device according to a second embodiment.
Figure 7B:
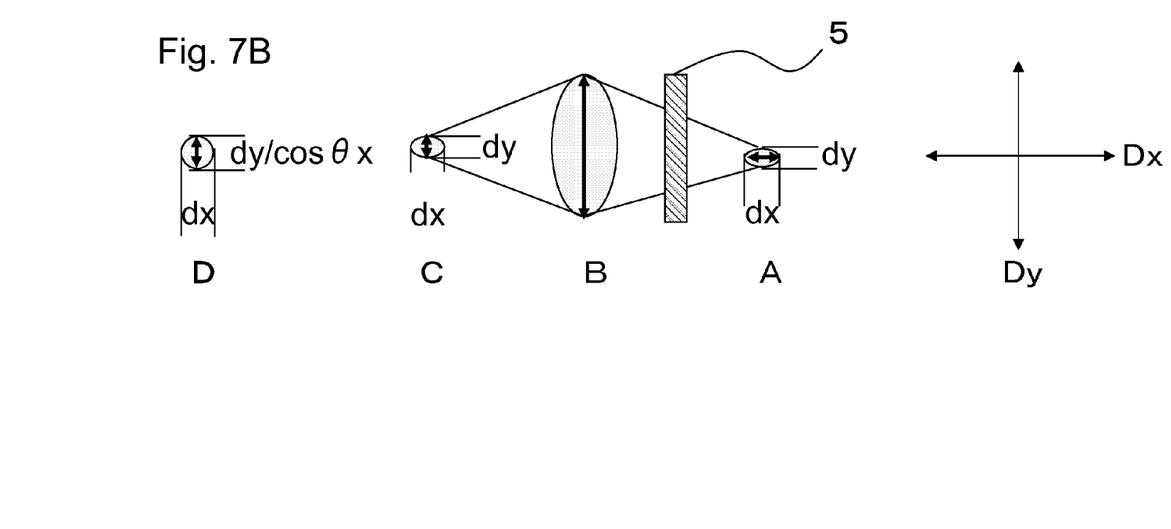
FIG. 7B is a schematic diagram showing a change in the beam shape of a laser beam in the light source device.

Hereinafter, a light source device according to the second embodiment of the present invention will be described in detail. FIGS. 7A and 7B is a schematic diagram showing the configuration of a light source device according to the embodiment. As shown in FIG. 7A, the basic configuration of the light source device according to the embodiment is similar to that of the light source device of the first embodiment. Thus, description of common components will be omitted, and only differences will be described.

Differences between the light source device of the second embodiment and the light source device of the first embodiment are the following two. One difference is that LD element 1 of the light source device of the second embodiment is rotated 90° with respect to that of the light source device of the first embodiment. The other difference is that in the light source device of the second embodiment, a ½ wavelength plate is disposed as a polarization conversion element between LD element 1 and lens 2. The ½ wavelength plate is located at an angle where the polarizing direction of a laser beam emitted from LD element 1 is rotated 90°.

In the embodiment, as in the case of the first embodiment, in a near-field surface (A surface), the short-axis direction of a laser beam section is defined as a Dy direction, and a long-axis direction is defined as a Dx direction. The diameter in the Dy direction is defined as dy, and the diameter in the Dx direction is defined as dx. However, LD element 1 of the light source device of the embodiment is rotated 90° with respect to that of the light source device of the first embodiment. Accordingly, the Dy direction and the Dx direction in the embodiment are different by 90° from those of the first embodiment. Similarly to the first embodiment, however, while the Dy direction and the Dx direction are unchanged in the optical system, the sizes and the size relationship of dy and dx change. In other words, in the embodiment, dy<dx is set in the near-field surface (A surface), while dy>dx is set in a far-field surface (B surface).

The laser beam emitted from LD element 1 is rotated 90° in polarizing direction by ½ wavelength plate 5. That is, the laser beam is polarized in the Dx direction before it enters ½ wavelength plate 5, while the laser beam is polarized in the Dy direction after its passage through ½ wavelength plate 5. Accordingly, for the laser beam to enter phosphor layer 3 as P-polarized light, LD element 1 and phosphor layer 3 are arranged so that the Dy direction can be vertical to a phosphor layer surface. When the laser beam enters phosphor layer 3 with an incident angle θ, the relationship between the incident angle θ and the beam diameter (dy, dx) of the laser beam is represented by the following formula:

$$\theta = \text{Arccos}(dy/dx)$$

That is, at the time when a laser beam enters the phosphor layer, dx takes a value that is obtained by multiplying dx with 1/cos θ before the laser beam enters the phosphor layer. Since cos θ is 0 or more to 1 or less (0≤cos θ≤1), dx/cos θ is larger than dx. Accordingly, by adjusting the incident angle θ, dy can be increased at the time when the laser beam enters the phosphor layer. In other words, at the time when the laser beam enters the phosphor layer, dy and dx can be matched with each other as much as possible. Further, by adjusting the incident angle θ, the laser beam can be formed into a circular shape. In this case, since the beam is formed into a circular shape by adjusting the incident angle θ, there is no need to use a component to create a circular shape, which thus leads to cost reduction.

Figure 8:
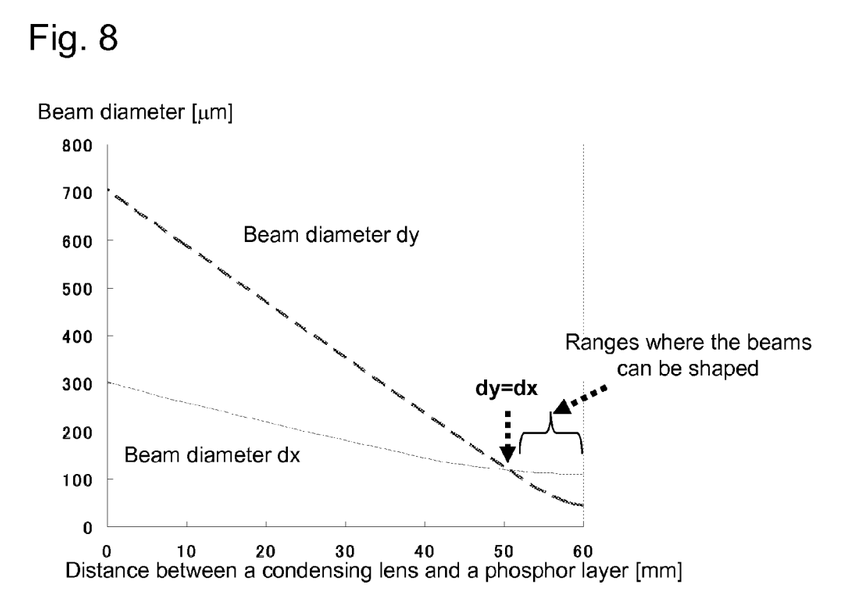
FIG. 8 is a view showing a relationship of beam diameter dy and beam diameter dx between a lens and a phosphor layer shown in FIG. 7A.

When the laser beam is condensed by lens 2 shown in FIGS. 7A and 7B, a beam waist is formed. At this time, by light diffraction, size relationship between dy and dx, whichever is bigger, changes between the area near the lens and the area near the beam waist. FIG. 8 shows a change in beam diameter (dy, dx) when a collimator laser beam of dy=700 μm and dx=300 μm is condensed by a lens having a focal length of 60 mm.

As can be understood from FIG. 8, the size relationship of dy and dx is switched from a point where the distance from lens 2 is 52 mm. In the case of the embodiment where the laser beam is linear polarized light polarized only in the Dy direction, when the condition of dx>dy is satisfied, the beam can be formed into a circular shape. In other words, when the distance between lens 2 and phosphor 3 shown in FIGS. 7A and 7B is shorter than 52 mm, the beam can be formed into a circular shape by adjusting the incident angle θ. When dx≤dy is set before the laser beam enters phosphor layer 3, dy is further increased by multiplying dy with 1/cos θ. Thus, the beam cannot be formed into a circular shape by adjusting the incident angle θ.

More detailed description will be made by using specific numerical values. It is assumed that the output Pin of the laser beam emitted from LD element 1 shown in FIG. 7A is 500 mW and the refractive index n of phosphor layer 3 is 2.0. It is also assumed that dx is 100 μm and dy is 45 μm immediately before the laser beam enters phosphor layer 3 (C surface shown in FIGS. 7A and 7B). In this case, when the incident angle θ is set to 63.4°, cos θ is 0.448. Accordingly, dy is about 100 μm (45/0.448) at the time when the laser beam enters the phosphor layer (D surface shown in FIGS. 7A and 7B). Further, when the refractive index n is 2.0, Brewster's angle θb is 63.4° (refer to FIG. 5). Thus, as in the case of the first embodiment, the beam can be formed into a circular shape by using Brewster's angle of limited reflection.

As described above, the light source device of the second embodiment and the light source device of the first embodiment are similar to each other in that the beam is formed into a circular shape by adjusting the incident angle θ. However, the ranges where the beams can be formed into a circular shape are different. In the light source device of the embodiment, compared with the light source device of the first embodiment, the beam diameter of the laser beam that enters phosphor layer 3 can be smaller. In other words, etendue can be smaller.

In view of a reflectance, as in the case of the first embodiment, the incident angle θ is desirably within the range of 0°<θ<90°, more desirably within the range of 0°<θ≤80°, further desirably within the range of 0°<θ<75°.

The function of lens 2 shown in FIG. 7A can be realized by combining a plurality of lenses. For example, the function of lens 2 can be realized by a plano-convex lens for converting the laser beam into parallel light and a convex lens for condensing the laser beam converted into the parallel light. In this case, the plano-convex lens is located between LD element 1 and ½ wavelength plate 5, and the convex lens is located between ½ wavelength plate 5 and phosphor layer 3. The plano-convex lens is located with its flat surface directed to the LD element side. The convex lens is located with its convex surface directed to the phosphor layer side. The laser beam emitted from LD element 1 is converted into the parallel light by the plano-convex lens, and then enters into ½ wavelength plate 5. The laser beam that enters ½ wavelength plate 5 is rotated 90° in polarizing direction, and then enters the convex lens (condenser lens). The laser beam (parallel light) that enters the convex lens is condensed on phosphor layer 3.

When the lenses are installed in the aforementioned order, the laser beam is converted into parallel light before it enters ½ wavelength plate 5, and thus angle dependence is reduced. This prevents variance of rotation in the polarizing direction caused by the difference in optical path length, and reflection components can be reduced as much as possible. Aspherical lenses can be substituted for the plano-convex lens and the convex lens used in the embodiment.

Figure 9:
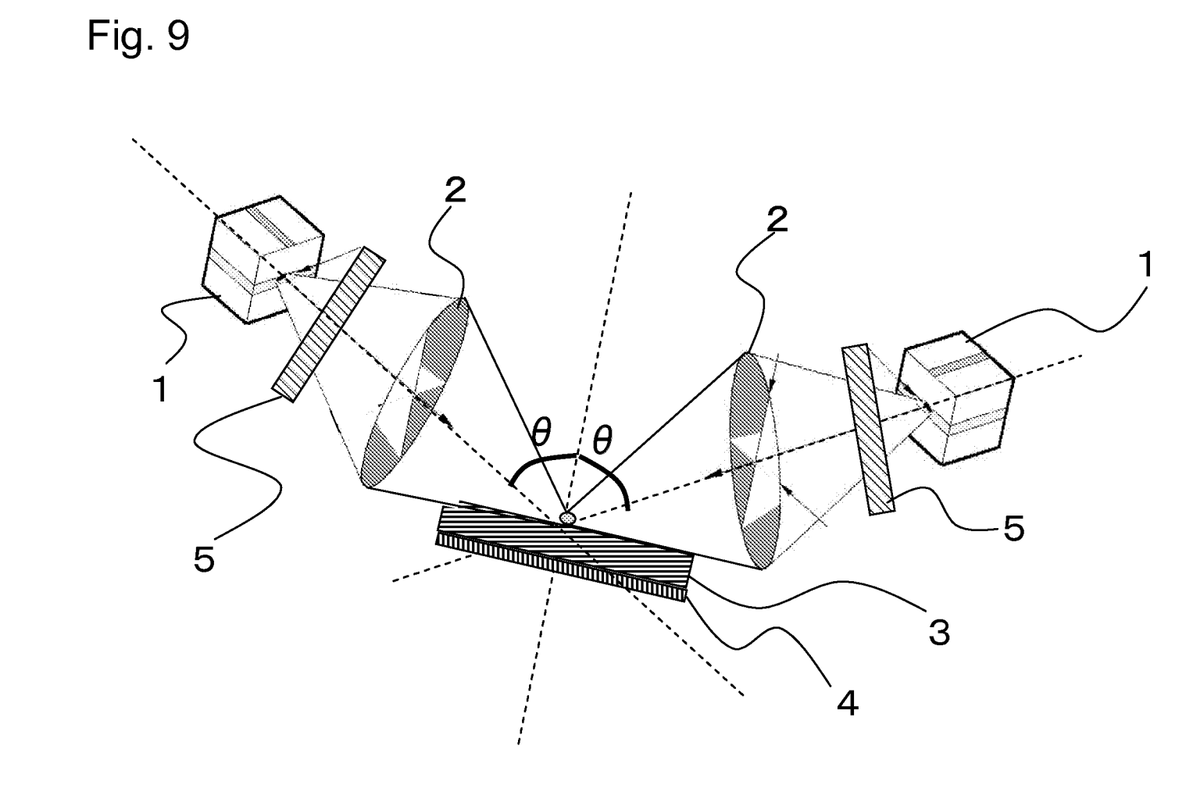
FIG. 9 is a schematic diagram showing a modified example of the light source device according to the second embodiment.

FIG. 9 shows the modified example of the second embodiment. In the shown modified example, the two sets of LD elements 1 and ½ wavelength plates 5 are arranged for one phosphor layer 3. A laser beam emitted from each LD element 1 enters as P-polarized light into common phosphor layer 3 with an incident angle θ. As described above, the incident angle A is optimized by taking Brewster's angle and the circular shape of the beam into consideration.

In the modified example, laser beams emitted from the two LD elements are condensed at one point on the phosphor layer. Thus, a very small area on the phosphor layer can be excited with high efficiency. By locating a LD element at each side of the phosphor layer, laser beams emitted from all the LD elements can enter phosphor layer with an optimal incident angle θ.

Three or more sets of LD elements 1 and ½ wavelength plates 5 can be arranged for one phosphor layer 3.

Figure 10:
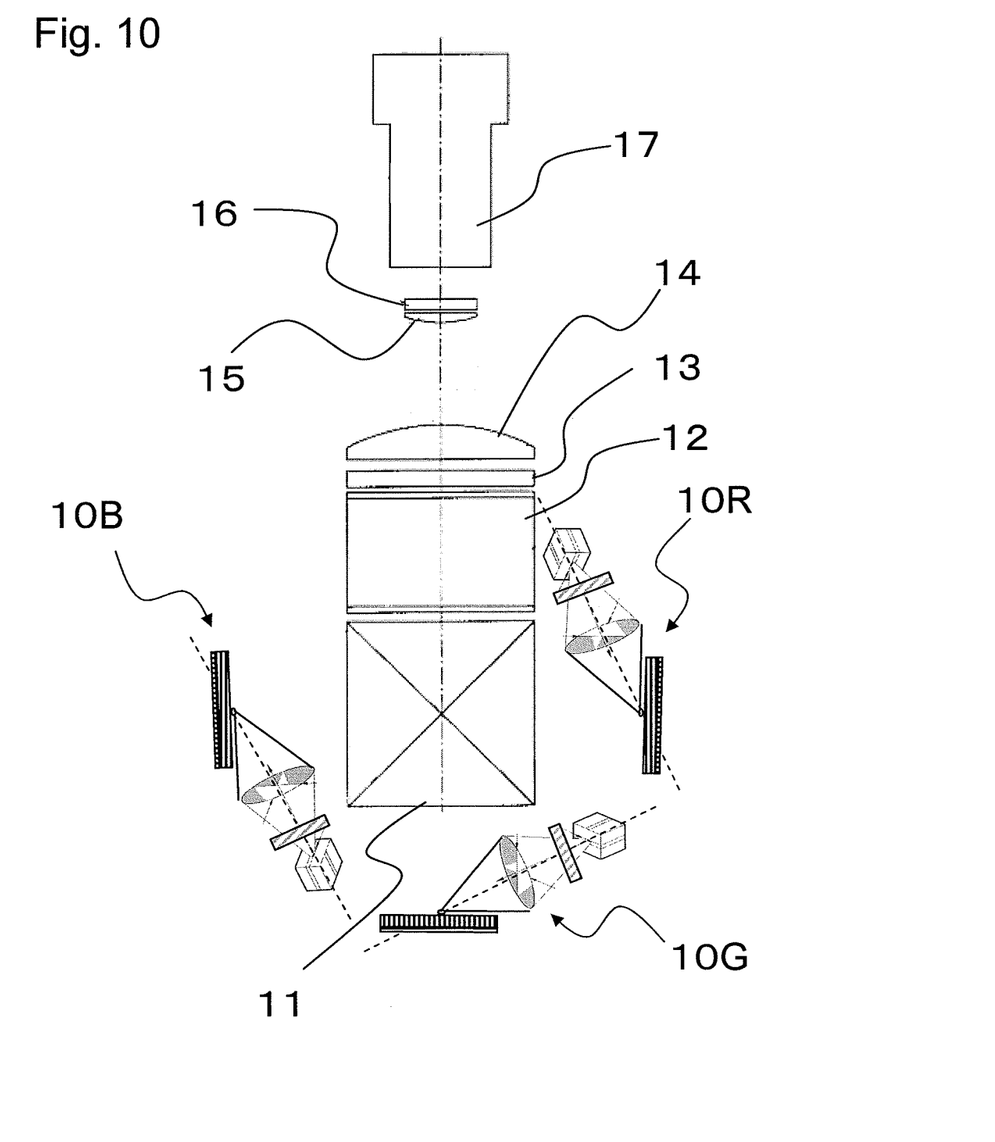
FIG. 10 is a schematic diagram showing an example of a projection type display device according to an embodiment.

FIG. 10 shows the configuration example of a projection type display device including the light source device of the present invention. The shown projection type display device includes three light source devices of the second embodiment. Light source device 10R emits red light, light source device 10G emits green light, and light source device 10B emits blue light.

Color synthesis prism 11 is disposed at the center of three light source devices 10R, 10G, and 10B. Color lights emitted from three light source devices 10R, 10G, and 10B enter from the predetermined incident surface of color synthesis prism 11 into prism 11 to be synthesized. The synthesized color light is output from the exit surface of the color synthesis prism.

Integrator 12, polarization conversion element 13, field lens 14, condenser lens 15, liquid crystal panel 16, and projection lens 17 are arranged in this order before the exit surface of the color synthesis prism.

Cadmium borate is used for the phosphor included in the phosphor layer of light source device 10R for emitting red light. Zinc silicate is used for the phosphor included in the phosphor layer of light source device 10G for emitting green light. Calcium tungstate is used for the phosphor included in the phosphor layer of light source device 10B for emitting blue light. However, the phosphor is not limited to the aforementioned materials. An appropriate material is appropriately selected according to the color light (linear polarized light) that is required.

Color light output from the exit surface of color synthesis prism 11 enters integrator 12. Integrator 12 makes the luminance distribution of the entered color light uniform. The light output from integrator 12 enters polarization conversion element 13. Polarization conversion element 13 makes the polarizing direction of the entered light uniform in a specific direction. The color light (linear polarized light) output from polarization conversion element 13 is applied to liquid crystal panel 16 via field lens 14 and condenser lens 15. Liquid crystal panel 16 modulates the entered light based on an image signal. The light modulated by liquid crystal panel 16 is extended and projected to a screen or the like not shown via a projection lens.

For integrator 12, a rod-type integrator, a light tunnel, or a fly-eye lens can be used.

The projection type display device including the light source device of the second embodiment has been described. However, the light source device of the first embodiment or the modified example can be used. The light source device of the present invention can be used for, in addition to the projection type display device, a vehicle head lamp, a search light, or a general lighting device.

Further, when the light source device of the present invention is used for a device or an instrument other than the projection type display device, exit light can be converted into parallel light by adding a lens or a reflector for condensing light flux that is discharged from the phosphor layer.

This application claims priority from Japanese Patent Application No. 2010-236537 filed Oct. 21, 2010, which is hereby incorporated by reference herein in its entirety.

REFERENCE NUMERALS

1 LD element
2 Lens
3 Phosphor layer
4 Reflection plate
5 ½ wavelength plate

What is claimed is:

1. A light source device comprising:
a light source unit including a laser diode emitting a laser beam polarized in a particular direction and a light collection optical system condensing the laser beam emitted from the laser diode; and
a phosphor layer excited by the laser beam condensed by the light collection optical system of the light source unit, the phosphor layer emitting incoherent light,
wherein the laser diode and the phosphor layer are arranged such that an incident angle, which is an angle formed between an optical axis of the laser beam and a normal line of the phosphor layer, is larger than 0° and smaller than 90° and such that the laser beam enters the phosphor layer as P-polarized light.

2. A light source device comprising:
a light source unit including a laser diode emitting a laser beam polarized in a particular direction, a polarization conversion element rotating a polarizing direction of the laser beam emitted from the laser diode, and a light collection optical system condensing the laser beam rotated in the polarizing direction by the polarization conversion element; and
a phosphor layer excited by the laser beam condensed by the light collection optical system of the light source unit, the phosphor layer emitting incoherent light, wherein:
an incident angle of the laser beam to the phosphor layer is larger than 0° and smaller than 90°; and
the laser beam enters the phosphor layer as P-polarized light.

3. The light source device according to claim 1, wherein a following relationship is established, in which θ denotes the incident angle, n1 denotes a refractive index of a medium around the phosphor layer, and n2 denotes a refractive index of the phosphor layer:

$$\theta = \mathrm{Arctan}(n2/n1).$$

4. The light source device according to claim 1, wherein a following relationship is established, in which θ denotes the incident angle, Dx and Dy respectively denote a long-axis direction and a short-axis direction in a laser beam section immediately after emission from the laser diode, and dx and dy respectively denote diameters of the Dx direction and the Dy direction in the laser beam section:

$$\theta = \mathrm{Arccos}(dx/dy).$$

5. The light source device according to claim 1, wherein a following relationship is established, in which θ denotes the incident angle, Dx and Dy respectively denote a long-axis direction and a short-axis direction in a laser beam section immediately after emission from the laser diode, and dx and dy respectively denote diameters of the Dx direction and the Dy direction in the laser beam section:

$$\theta = \mathrm{Arccos}(dx/dy).$$

6. The light source device according to claim 1, further comprising a reflection plate facing a surface of a reflection side opposite a surface of the phosphor layer into which the laser beam enters.

7. The light source device according to claim 1, further comprising a lens condensing a light flux emitted from the phosphor layer.

8. The light source device according to claim 1, further comprising a reflector condensing a light flux emitted from the phosphor layer.

9. The light source device according to claim 1, further comprising a plurality of light source units for one phosphor layer.

10. A projection type display device comprising:
the light source device according to claim 1.

11. The light source device according to claim 1, further comprising a polarization conversion element rotating a polarizing direction of the laser beam emitted from the laser diode, wherein
the light collection optical system condenses the laser beam rotated in the polarizing direction by the polarization conversion element.

12. The light source device according to claim 1, wherein a relationship "dy>dx" is established at a position of the phosphor layer, when Dx and Dy respectively denote a long-axis direction and a short-axis direction in a laser beam section immediately after emission from the laser diode, and dx and dy respectively denote diameters of the Dx direction and the Dy direction in the laser beam section.

13. The light source device according to claim 2, wherein the polarization conversion element is a half-wave plate.

14. The light source device according to claim 2, wherein a relationship "dx>dy" is established at a position of the phosphor layer, when Dx and Dy respectively denote a long-axis direction and a short-axis direction in a laser beam section immediately after emission from the laser diode, and dx and dy respectively denote diameters of the Dx direction and the Dy direction in the laser beam section.

* * * * *